(12) United States Patent
Dixon et al.

(10) Patent No.: US 6,581,190 B1
(45) Date of Patent: Jun. 17, 2003

(54) METHODOLOGY FOR CLASSIFYING AN IC OR CPU VERSION TYPE VIA JTAG SCAN CHAIN

(75) Inventors: Robert Christopher Dixon, Austin, TX (US); Timothy Michael Lambert, Austin, TX (US); Howard Carl Tanner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/451,955

(22) Filed: Nov. 30, 1999

(51) Int. Cl.[7] ............................................. G06F 17/50
(52) U.S. Cl. .................... 716/4; 716/6; 714/724; 714/728; 714/726; 714/727; 714/30
(58) Field of Search ................. 716/1–21; 257/200; 382/232; 703/23; 710/316; 712/222, 227, 300; 714/30, 724, 726, 727, 728, 739

(56) References Cited

U.S. PATENT DOCUMENTS 5,329,471 A  * 7/1994 Swoboda et al. ............ 703/23
5,694,401 A  * 12/1997 Gibson ....................... 714/728
6,243,843 B1 * 6/2001 Parker et al. ............... 714/726

* cited by examiner

*Primary Examiner*—Matthew Smith
*Assistant Examiner*—H. Rossoshek
(74) *Attorney, Agent, or Firm*—Duke W. Yee; Mark E. McBurney; Cathrine K. Kinslow

(57) ABSTRACT

A method in a data processing system for identifying a circuit. In a preferred embodiment, a set of bits, with a defined chain length, are shifted into the circuit one bit at a time. The bits shifted out from the circuit are compared to the bits, from the set of bits, shifted into the circuit to determine if the circuit corresponds to a first type circuit. The comparing step is accomplished before all bits in the set of bits have been shifted into the circuit. If the circuit is not a first type circuit corresponding to the set of bits shifted into the circuit, then the shifting of bits into the circuit is discontinued and the process is repeated with a second set of bits corresponding to a second circuit type until the circuit type has been identified.

27 Claims, 4 Drawing Sheets

PSEUDO CODE

501 — Set up to bypass all ICs in the chain except for the processor in question.
502 — scan_length = A_chain_length;
503 — for (j=0, j=scan_length, j++)
     { 504
505 — Shift one bit into service processor;
506 — Store bit and modify accordingly;
507 — Shift bit back into system processor;
     Compare the last few scanned bits with the beginning of the chain;
     if the pattern (given sufficient sampling of bits) begins to repeat — 508
        then (CPU_type = Version_B) else (CPU_type = Version_A) — 509
510 — }

511 — if (CPU_type == Version_B)
512 —   then (take appropriate action to rescan with proper chain length for B)
513 —   else (continue knowing that Version_A is present with a properly modified chain)

METHODOLOGY FOR CLASSIFYING AN IC OR CPU VERSION TYPE VIA JTAG SCAN CHAIN

BACKGROUND OF THE INVENTION

1. Technical Field

The present invention relates to computer software and, more particularly, to methods for classifying an integrated circuit or central processing unit version type via a JTAG scan chain.

2. Description of Related Art

Presently, a trend exists towards smaller electronic components which has resulted in higher component density and greater circuit complexity on a given-sized circuit board. The increase in circuit complexity has increased the difficulty of accomplishing in-circuit testing by physically accessing the circuits with a test fixture so that the response of the circuits to an external stimulus can be sensed. Indeed, as surface-mounted components (i.e., components which are mounted on a major surface of the circuit board) proliferate, physical access to the circuits on the board by traditional test fixtures may become impossible. For these reasons, much effort has been devoted to developing alternative testing techniques.

A testing technique known as "boundary scan" has gained prominence as an alternative to traditional in-circuit testing by physically accessing the board through a test fixture. The boundary scan testing technique is embodied in a detailed specification (Version 2.0) authored by an international standards committee known as the Joint Test Action Group (JTAG).

Accomplishing boundary scan testing requires that in addition to its normal application logic, each active component (e.g., integrated circuits) be fabricated with circuits known as "boundary scan cells" (BSCs) whose details are described in the JTAG standard. Each BSC is coupled between the application logic and one of the functional input and output pins of the integrated circuit such that each functional input and output pin is coupled to a separate one of a normal data input and normal data output, respectively, of the BSC.

During normal operation of the integrated circuit, the signal applied to each functional input pin passes through the corresponding BSC and then into the application logic without effect. Similarly, signals from the application logic pass through the corresponding BSCs to each separate functional output pin without effect. Thus, the normal operation of the integrated circuit remains unaffected by the BSCs.

In addition to its normal data input and output, each BSC has a test data input and test data output (also known as test access ports) connected so that each bit of a test vector applied to the test data input is serially shifted to the test data output of the BSC during operation thereof in a test mode. Also, the test data input of each BSC is linked to its normal data output so the test vector bit, shifted into the BSC during testing, can be applied to its normal data output.

In certain circumstances, rather than testing an IC or CPU, an integrated circuit's (IC's) or a central processing unit's (CPU's) mode of operation may need to be changed after it has shipped to customers. This need may be due to problems discovered after development testing or for performance enhancements being applied after a system is delivered to the customer. The JTAG port (also known as a test access port), rather than being used merely for testing purposes, also is commonly used in International Business Machine Corporation's and in other vendor's products to initialize the major ICs and CPU(s) prior to startup.

When a computer system needs corrective action via the test access port, the device must first be identified. In the case of a CPU, the CPU identification number is normally scanned out and compared with a list of possible identification numbers. When a candidate identification number is found, the corrective action can be taken by scanning new data into the CPU. If the CPU is not a candidate for corrective action, then no scanning in of new data is performed.

In the case of scanning an identification number, the action is time consuming and requires a large and complex program to first scan in an identification number and then compare that number with a list of candidate numbers for corrective action. Therefore, it is desirable to have a method and system for efficiently determining the identity of an integrated circuit or CPU that is less time consuming and requires a smaller and less complex program to perform the task than currently available methods and systems.

SUMMARY OF THE INVENTION

The present invention provides a method in a data processing system for identifying a circuit. In a preferred embodiment, a set of bits, with a defined chain length, are shifted into the circuit one bit at a time. The bits shifted out from the circuit are compared to the bits, from the set of bits, shifted into the circuit to determine if the circuit corresponds to a first type circuit. The comparing step is accomplished before all bits in the set of bits have been shifted into the circuit. If the circuit is not a first type circuit corresponding to the set of bits shifted into the circuit, then the shifting of bits into the circuit is discontinued and the process is repeated with a second set of bits corresponding to a second circuit type until the circuit type has been identified.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 shows a sample pseudo code for differentiating between two possible CPU versions in accordance with the present invention.

DETAILED DESCRIPTION OF THE PREFERRED EMBODIMENT

Figure 1:
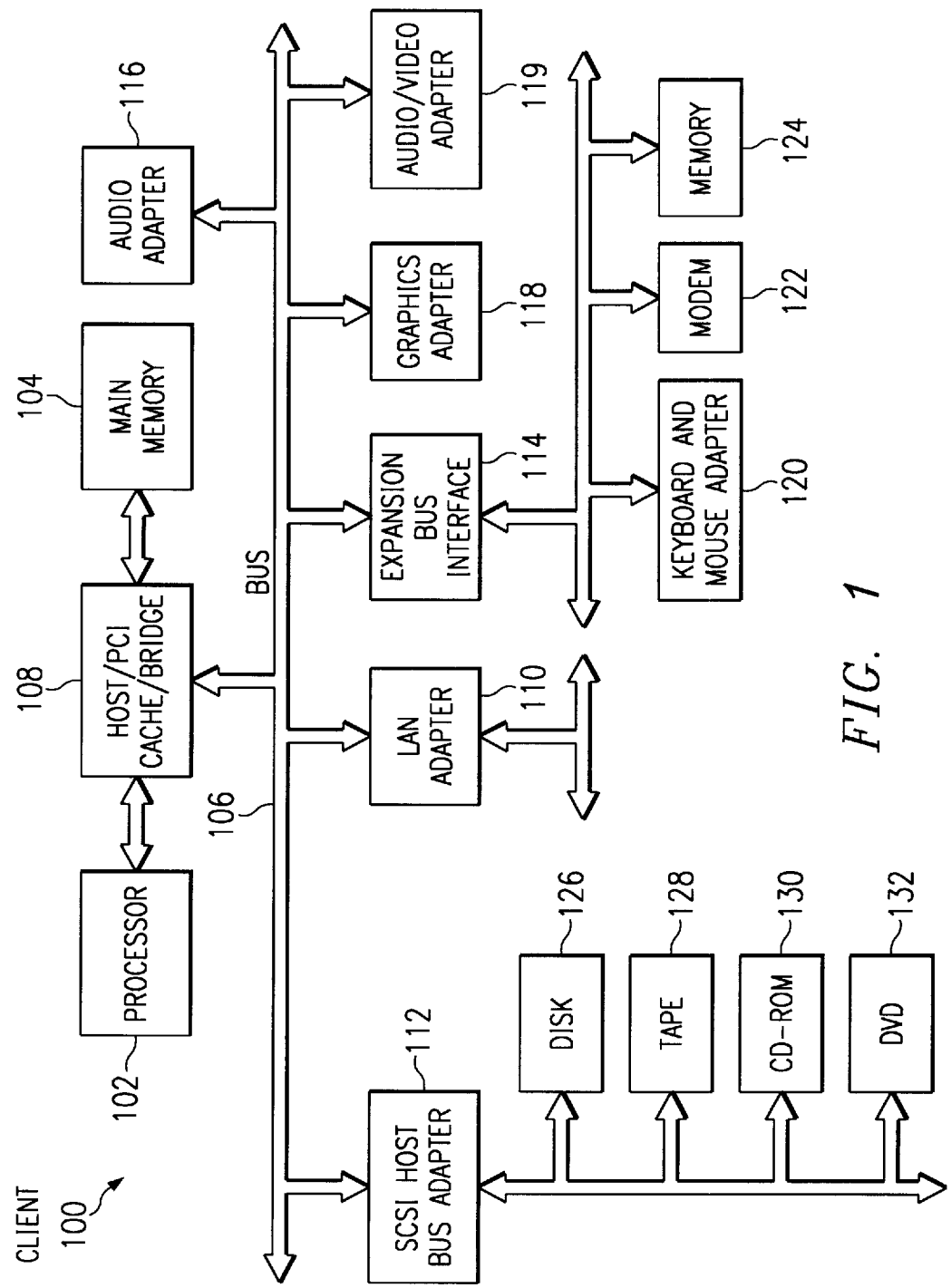
FIG. 1 depicts a block diagram of a data processing system in which the present invention may be implemented.

With reference now to FIG. 1, a block diagram of a data processing system in which the present invention may be implemented is illustrated. Data processing system 100 is an example of a client computer. Data processing system 100 employs a peripheral component interconnect (PCI) local bus architecture. Although the depicted example employs a PCI bus, other bus architectures, such as Micro Channel and ISA, may be used. Processor 102 and main memory 104 are connected to PCI local bus 106 through PCI bridge 108. PCI bridge 108 may also include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter (A/V) 119 are connected to PCI local bus 106 by add-in boards inserted into expansion slots. Expansion bus interface 114 provides a connection for a keyboard and mouse adapter 120, modem 122, and additional memory 124. In the depicted example, SCSI host bus adapter 112 provides a connection for hard disk drive 126, tape drive 128, CD-ROM drive 130, and digital video disc read only memory drive (DVD-ROM) 132. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system, such as OS/2, which is available from International Business Machines Corporation. "OS/2" is a trademark of International Business Machines Corporation. An object oriented programming system, such as Java, may run in conjunction with the operating system, providing calls to the operating system from Java programs or applications executing on data processing system 100. Instructions for the operating system, the object-oriented operating system, and applications or programs are located on a storage device, such as hard disk drive 126, and may be loaded into main memory 104 for execution by processor 102.

Those of ordinary skill in the art will appreciate that the hardware in FIG. 1 may vary depending on the implementation. For example, other peripheral devices, such as optical disk drives and the like, may be used in addition to or in place of the hardware depicted in FIG. 1. The depicted example is not meant to imply architectural limitations with respect to the present invention. For example, the processes of the present invention may be applied to multiprocessor data processing systems.

Figure 2:
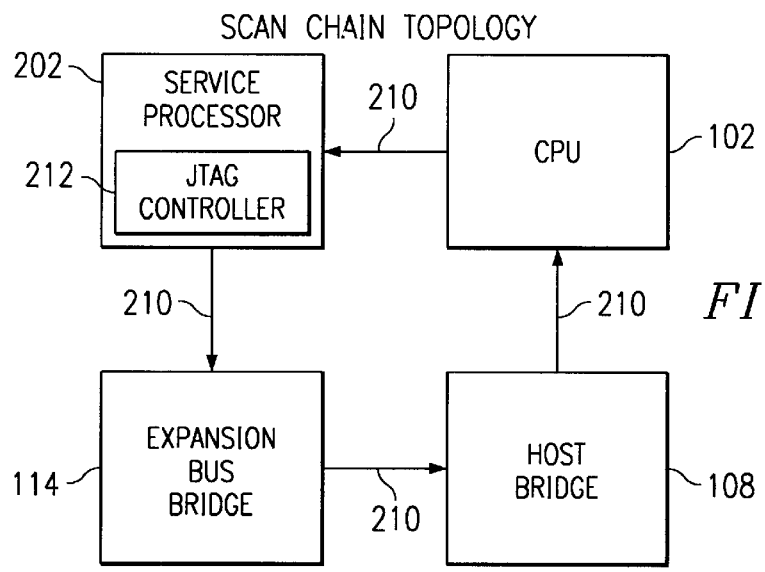
FIG. 2 depicts a block diagram illustrating a typical scan chain topology in accordance with the present invention.

Referring now to FIG. 2, a block diagram illustrating a typical scan chain topology is depicted in accordance with the present invention. Scan chain topology 200 is an example of a topology that may exist in a data processing system, such as data processing system 100 in FIG. 1. In the depicted example, scan chain topology 200 includes service processor 202, central processing unit (CPU) 102, host bridge 108, expansion bus bridge 114, and Joint Test Action Group (JTAG) bus 210. As used herein and in the Figures, similar reference numbers are used to refer to similar or identical elements.

Service processor 202 includes JTAG controller 212 and a mini-processor (not shown) and may include other units that are not depicted such as, for example, an internal memory and many general purpose input/output pins. JTAG controller 212 is used for configuration, mode setting and error reporting purposes.

Service processor 202 is connected to CPU 102 via JTAG bus 210 through the data in test access port to CPU 102.

JTAG bus 210 is a serial bus with one data bit and several control signal bits. (Each of units 102, 108, and 114 are integrated circuits and the terms "unit" and "integrated circuit" may be used interchangeably herein.) The data out test access port of service processor 202 is connected to the data in test access port of expansion bus bridge 114 via JTAG bus 210. The data out test access port of expansion bus bridge 114 is connected to the data in test access port of host bridge 108 via JTAG bus 210, and the data out test access port of host bridge 108 is connected to data in test access port of CPU 102. The data out test access port of the CPU 102 is connected to the data in test access port of the service processor 202 via JTAG bus 210. Thus, each of the integrated circuits (ICs), CPU 102, host bridge 108, and expansion bus bridge 114, are daisy-chained together in a serial manner. Therefore, JTAG controller 212 has access to the internal registers of each of the ICs within the chain.

The test access port to each of units 102, 108, and 114 is used to access configuration and error logging registers within each unit. Each port manifests itself as a few signals that allow access to a string of internal registers that create the ability for an external device, such as in this case, service processor 202, to modify configuration and mode setting bits. Service processor 202 keeps track of which units (integrated circuits) exist in the daisy-chain linked by JTAG bus 210 and in what topology they are interconnected. Through the control signals carried by JTAG bus 210, a particular one of ICs 102–114 in the daisy-chain may be selected for modification while all other of units 102–114 are bypassed by the scan chain bits.

The scan chain topology depicted in FIG. 2 is given merely as an example and is not meant to imply any architectural limitation. More or fewer ICs could be included within the daisy-chain depending on implementation.

Figure 3:
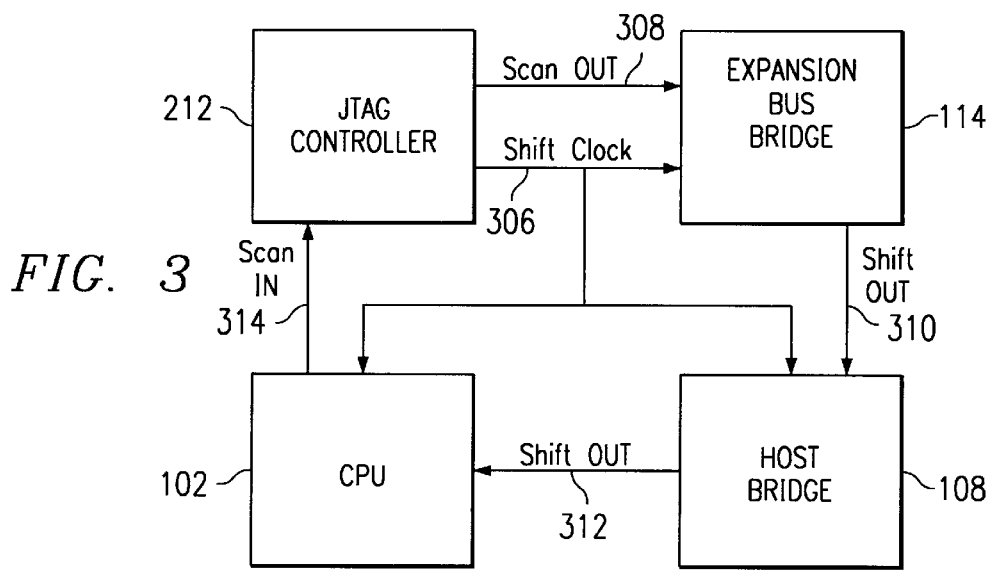
FIG. 3 depicts a block diagram illustrating the flow of scan bits between a JTAG controller and a CPU in accordance with the present invention.

Referring now to FIG. 3, a block diagram illustrating the flow of scan bits between a JTAG controller and a CPU is depicted in accordance with the present invention. When it is desired to change the operation mode or update CPU 102, which may be implemented as processor 102 in FIG. 1, a JTAG controller 212 is connected to the test access port of CPU 102. The other ICs 108 and 114 in the daisy-chain are disabled via special 8 bit commands that are shifted into them via the JTAG controller. The commands cause the target ICs to route the signal on the data in pin to the data out pin each time a scan clock 306 signal is received, thereby making the IC transparent to the chain. This introduces a one clock delay for every chip in the chain that is disabled, but allows JTAG controller 212 to isolate the chain to being the one IC or CPU in which identification method is being performed.

The corrective action to modify the mode of operation of CPU 102 is to scan a chain of bits into JTAG controller 212 from the test access port of CPU 102, modify this chain of bits, and scan them out to CPU 102 one bit at a time. Since a different corrective action is needed for each different version of the central processing unit (CPU) and integrated circuit (IC), the identity of the version of the CPU being modified is needed to determine what corrective action need be taken. However, the set of all possible initial bit patterns is defined for each integrated circuit (IC) and central processing unit (CPU) version. Furthermore, each different integrated circuit and central processing unit (CPU) version inherently possesses a different long scan chain length that is hardwired in the chip. Therefore, rather than scan out an identification number from CPU 102 and comparing it with a list of candidate numbers for corrective action as done in the prior art and then modifying the mode of operation of the CPU based on this identification, an assumption is made as to the identity of CPU 102.

Figure 4:
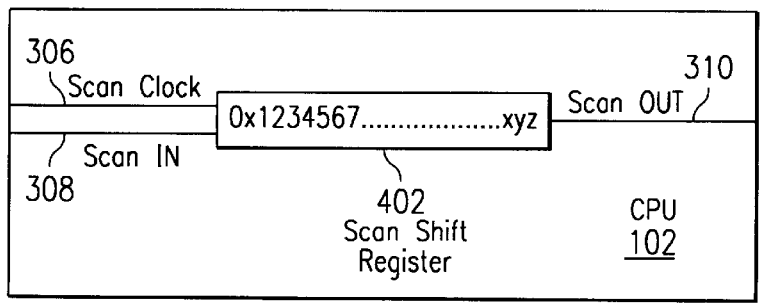
FIG. 4 depicts a scan shift register within a CPU with scan in and out signals in accordance with the present invention.

Chain bits from the test access port of CPU 102 are scanned out 314 and into JTAG controller 212, modified using the modification data for the assumed CPU version, and scanned back into the test access port of CPU 102. As depicted in FIG. 4, the chain bits are being scanned out 314 of scan shift register 402 within CPU 102 and the resulting output of JTAG controller 212 is scanned in 308 to the input port of expansion bus bridge 114. Shift clock 306 is connected to each of the units 108, 114, and 102 in the chain.

When each unit 102, 108, and 114 receives a clock, they each shift the chain by 1 bit. Since the units 102, 108, and 114 are serially chained, the output of one becomes the input of another. Thus, scan out 308, which is the input to expansion bus bridge 114 results in the last bit in the chain within expansion bus bridge 114 to be shifted out 310 to the input of host bridge 108. Similarly, the last bit within the chain within host bridge 108 is shifted out 312 to the input of CPU 102. Thus, the scan clock 306 is the control signal that causes the entire chain to be shifted. One clock results in a 1 bit shift.

As the chain bits are being scanned into JTAG controller 212, each bit is compared with the value expected for that particular bit. If these values do not match, then the version of CPU 102 is different than that assumed. Thus, all ICs within the daisy-chain must be reset and the process repeated with the modification data for the next possible version of CPU 102.

If the value of the scanned out bit and the expected value match, then the process continues with the scanned out bits modified using the assumed CPU version modification data. Each time the value of the scanned out bit and the expected value of that bit match, the confidence level that version of CPU 102 is the same as the assumed version increases by a factor of 2. Thus, the confidence level increases rather quickly as the probability of either a match or mismatch increases. Depending on implementation and the confidence level desired, the comparison step may be discontinued before all of the chain bits have been scanned out of CPU 102.

By not scanning the entire chain and checking the identification bits of an integrated circuit prior to performing the desired modification, program complexity is reduced. Since the processes of the present invention is part of the initialization failure process, reduced time is needed to initialize devices within a data processing system. Furthermore, typical IC scan chains are very long, often many thousands of bits long. If the entire scan chain were stored, decoded and compared to a list of potential IC identification codes, as was done in the prior art, an external memory would have to be provided to the service processor/JTAG controller. However, with the method of the present invention, by identifying the IC "on-the-fly" (i.e., as the modification steps are performed), such external memory is not required. Thus, the present invention saves money by allowing the elimination of such external memory.

Referring now to FIG. 5, a sample pseudo code for differentiating between two possible CPU versions is shown in accordance with the present invention. Pseudo code 500 determines a processor version from between two possible candidates—version A with a given chain length and version B with a shorter chain length. In line 501, the JTAG controller is set up to bypass all ICs in the daisy chain except for the processor for which modification is needed. In line 502, the scan length is set to equal the scan length for processor version A, which has the longer scan length of the two processor versions. In lines 503–506, the process of shifting (or scanning) bits from the processor in question into the JTAG controller one at a time, modifying the bit according to the modification code for processor version A, and scanning the modified bit back into the process in question is performed. In lines 507–510, the bits scanned out of the processor in question are compared to the expected values for those bits. The expected value is the value those bits would have if the version of the processor in question was version A.

Once a sufficient number of bits have been compared for the appropriate level of confidence to be achieved, then it is determined whether the version of the processor in question is version B in line 511. In line 512, if it has been determined that the version of the processor in question is version B, then appropriate action to reset the ICs in the chain and to rescan the processor with the proper chain length for version B. In line 513, if it has been determined that the version of the processor in question is version A, then the process continues knowing that the proper modification to the processor in question is being made.

Figure 6:
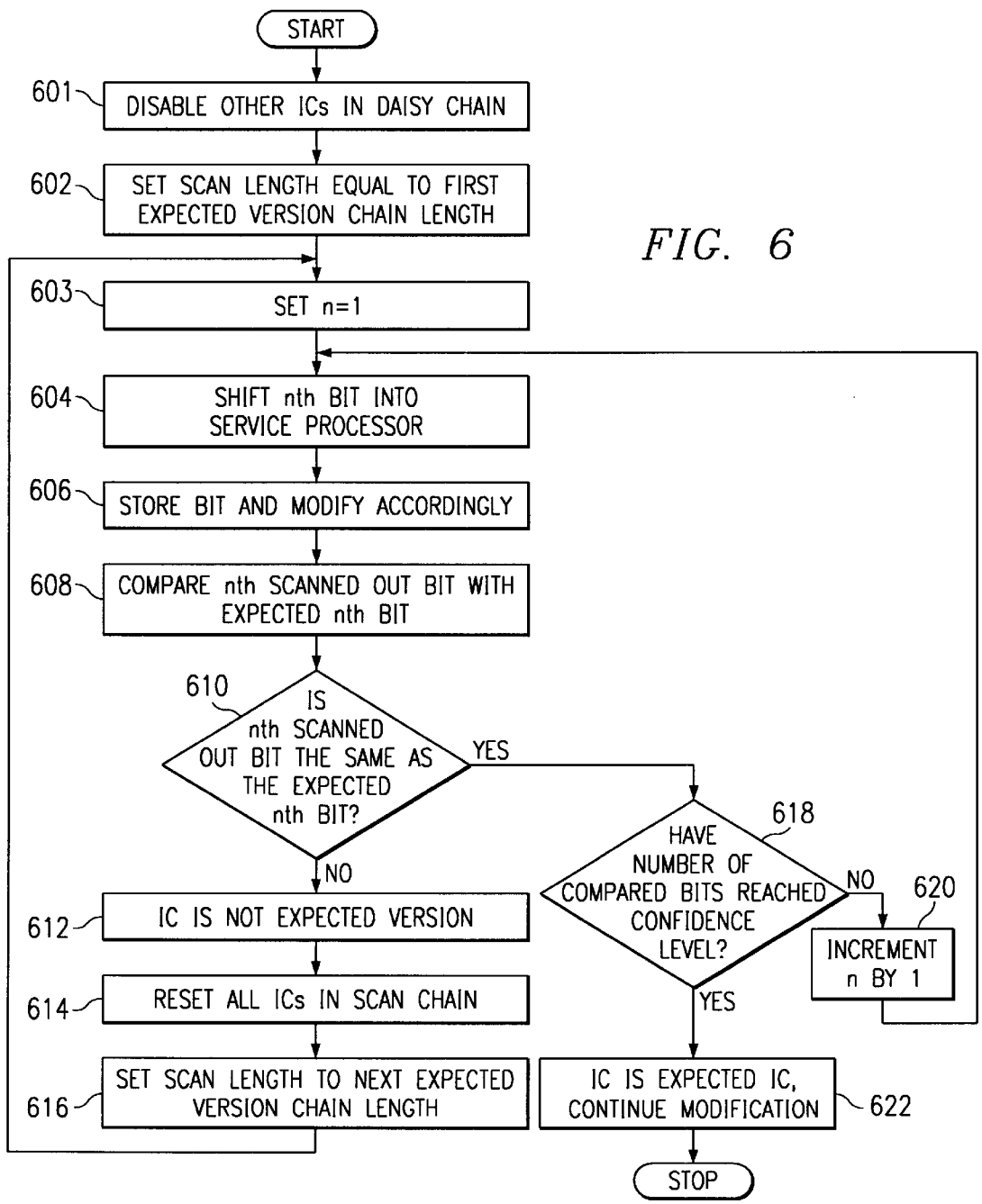
FIG. 6 depicts a flowchart illustrating a method of identifying the version of an integrated circuit to be modified out of multiple possible versions in accordance with the present invention.

Referring now to FIG. 6, a flowchart illustrating a method of identifying the version of an integrated circuit to be modified out of multiple possible versions is depicted in accordance with the present invention. First, all integrated circuits (ICs) in the daisy chain except for the IC of interest are disabled (step 601). Next, the scan length is set equal to the scan length of the first possible version of the IC (step 602). Next, a value "n" is set equal to 1 (step 603). Next, the $n^{th}$ bit is shifted out of the IC in question and into the service processor (step 604). This bit is then stored, modified, and scanned back into the IC according to the modification scheme for the first possible version for the IC (step 606). This $n^{th}$ bit scanned out from the IC is then compared with the beginning of the chain for the version of the IC that is currently expected, in this case, the first possible version (step 608). Next, it is determined if the scanned $n^{th}$ bit is the same as the expected value (step 610).

If the value of the nth scanned bit is not the value expected for this version of the IC, then the IC is not the currently expected version (step 612). In this case, all of the ICs in the scan chain are reset (step 614) since the chain is no longer at the start. The expected version is set to the next possible version and the scan length is set to the scan length of the next possible version (step 616). The process of scanning bits is then started over with step 603 except that the modification process will correspond to that of the newly selected version and the expected value of the scanned out bits will be compared to that expected from an IC of the newly selected version type.

If the $n^{th}$ scanned out bit is the same as the expected value, then it must be determined if a sufficient number of bits have been scanned out such that the integrated circuit can be identified as being the version currently assumed with a sufficient amount of confidence. The appropriate level of confidence may vary depending on implementation and the length of the scan chains. If the appropriate confidence level has not been reached, then "n" is increased by one (step 620) and the process continues with step 604. If the confidence level has been reached, then the IC is the expected IC and modification continues with the knowledge that the correct modification is being performed (step 622).

Although the processes and systems of the present invention have been described primarily with reference to identifying a central processing unit, it will be recognized that the present invention may be applied to determining the identity of any integrated circuit having a test access port.

It is important to note that while the present invention has been described in the context of a fully functioning data processing system, those of ordinary skill in the art will appreciate that the processes of the present invention are capable of being distributed in a form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application and to enable others of ordinary skill in the art to understand the invention for various embodiments with various modifications as are suited to the particular use contemplated.

What is claimed is:

1. A method in a data processing system for identifying a circuit, comprising the steps of:
   shifting into the circuit a set of bits with a defined chain length, wherein bits are shifted out of the circuit; and
   comparing the bits shifted out of the circuit to the set of bits initially shifted into the circuit to determine if the circuit corresponds to a first type circuit, wherein the comparing step is performed before all bits in the set of bits have been shifted into the circuit.

2. The method as recited in claim 1, further comprising, responsive to a determination that the circuit is a first type circuit, continuing to shift the set of bits into the circuit until all of the set of bits have been shifted into the circuit, thus changing the mode of operation of the circuit.

3. The method as recited in claim 1, further comprising, responsive to a determination that the circuit is not a first type circuit, discontinuing the shifting of bits from the set of bits into the circuit.

4. The method as recited in claim 3, wherein the set of bits is a first set of bits and further comprising:
   performing said shifting and comparing steps using a second set of bits rather than a first set of bits to determine whether the circuit is a second type circuit.

5. The method as recited in claim 1, wherein the circuit is an integrated circuit.

6. The method as recited in claim 1, wherein the set of bits are shifted into the circuit utilizing a test access port.

7. The method as recited in claim 1, wherein the comparing step is performed one bit at a time.

8. A method in a data processing system for identifying a circuit, comprising the steps of:
   shifting into the circuit a set of bits with a defined chain length, wherein bits are shifted out of the circuit; and
   comparing the bits shifted out of the circuit to the set of bits initially shifted into the circuit to determine if the circuit corresponds to a first type circuit, wherein the comparing step is performed before all bits in the set of bits have been shifted into the circuit;
   wherein the circuit is a central processing unit.

9. A computer program product in computer readable media for use in a data processing system for identifying a circuit, the computer program product comprising:
   first instructions for shifting into the circuit a set of bits with a defined chain length, wherein bits are shifted out of the circuit; and
   second instructions for comparing the bits shifted out of the circuit to the set of bits initially shifted into the circuit to determine if the circuit corresponds to a first type circuit, wherein the comparing step is performed before all bits in the set of bits have been shifted into the circuit.

10. The computer program product as recited in claim 9, further comprising, responsive to a determination that the circuit is a first type circuit, third instructions for continuing to shift the set of bits into the circuit until all of the set of bits have been shifted into the circuit, thus changing the mode of operation of the circuit.

11. The computer program product as recited in claim 9, further comprising, responsive to a determination that the circuit is not a first type circuit, third instructions for discontinuing the shifting of bits from the set of bits into the circuit.

12. The computer program product as recited in claim 11, wherein the set of bits is a first set of bits and further comprising:
   fourth instructions for performing said shifting and comparing steps using a second set of bits rather than a first set of bits to determine whether the circuit is a second type circuit.

13. The computer program product as recited in claim 9, wherein the circuit is an integrated circuit.

14. The computer program product as recited in claim 9, wherein the set of bits are shifted into the circuit utilizing a test access port.

15. The computer program product as recited in claim 9, wherein the comparing step is performed one bit at a time.

16. A computer program product in computer readable media for use in a data processing system for identifying a circuit, the computer program product comprising:
   first instructions for shifting into the circuit a set of bits with a defined chain length, wherein bits are shifted out of the circuit; and
   second instructions for comparing the bits shifted out of the circuit to the set of bits initially shifted into the circuit to determine if the circuit corresponds to a first type circuit, wherein the comparing step is performed before all bits in the set of bits have been shifted into the circuit;
   wherein the circuit is a central processing unit.

17. A data processing system for identifying a circuit, comprising:
   means for shifting into the circuit a set of bits with a defined chain length, wherein bits are shifted out of the circuit; and
   means for comparing the bits shifted out of the circuit to the set of bits initially shifted into the circuit to determine if the circuit corresponds to a first type circuit, wherein the comparing step is performed before all bits in the set of bits have been shifted into the circuit.

18. The system as recited in claim 17, further comprising, responsive to a determination that the circuit is a first type circuit, means for continuing to shift the set of bits into the circuit until all of the set of bits have been shifted into the circuit, thus changing the mode of operation of the circuit.

19. The system as recited in claim 17, further comprising, responsive to a determination that the circuit is not a first type circuit, means for discontinuing the shifting of bits from the set of bits into the circuit.

20. The system as recited in claim 19, wherein the set of bits is a first set of bits and further comprising:

means for performing said shifting and comparing steps using a second set of bits rather than a first set of bits to determine whether the circuit is a second type circuit.

21. The system as recited in claim 17, wherein the circuit is an integrated circuit.

22. The system as recited in claim 17, wherein the set of bits are shifted into the circuit utilizing a test access port.

23. The system as recited in claim 17, wherein the comparing step is performed one bit at a time.

24. A data processing system for identifying a circuit, comprising:

means for shifting into the circuit a set of bits with a defined chain length, wherein bits are shifted out of the circuit; and means for comparing the bits shifted out of the circuit to the set of bits initially shifted into the circuit to determine if the circuit corresponds to a first type circuit, wherein the comparing step is performed before all bits in the set of bits have been shifted into the circuit;

wherein the circuit is a central processing unit.

25. A data processing system for identifying an integrated circuit, comprising:

a service processor comprising a controller;

a plurality of integrated circuits; and a bus connecting said service processor to test access ports for each of the plurality of integrated circuits in a daisy chain fashion, wherein the bus comprises at least one data bit and a plurality of control signal bits; wherein the controller scans a set of bits needed for modifying a specified one of the plurality of integrated circuits onto the bus, wherein all but the specified one of the plurality of integrated circuits are configured to ignore the set of bits, and wherein the set of bits correspond to a first version type of integrated circuit; and bits scanned out of the specified one of the plurality of integrated circuits are compared bit by bit to an expected value to determine the identity of the integrated circuit.

26. The system as recited in claim 25, wherein the set of bits is a first set of bits and the service processor is configured to abort scanning the first set of bits, reset each of the plurality of integrated circuits, and rescan with a second set of bits in response to a determination that the integrated circuit is not of a version corresponding to the first version type, wherein the second set of bits correspond to a second version type of integrated circuit.

27. The system as recited in claim 25, wherein the controller is a joint test action group controller.

* * * * *